United States Patent [19]
Maru

[11] Patent Number: 5,568,089
[45] Date of Patent: Oct. 22, 1996

[54] FULLY DIFFERENTIAL AMPLIFIER INCLUDING COMMON MODE FEEDBACK CIRCUIT

[75] Inventor: Tsuguo Maru, Tokyo, Japan

[73] Assignee: NEC Corporation, Tokyo, Japan

[21] Appl. No.: 260,315

[22] Filed: Jun. 15, 1994

[30] Foreign Application Priority Data

Jun. 15, 1993 [JP] Japan .................................. 5-142472

[51] Int. Cl.$^6$ ...................................................... H03C 3/45
[52] U.S. Cl. ............................ 330/253; 330/257; 330/258
[58] Field of Search ....................................... 330/253, 257, 330/258

[56] References Cited

U.S. PATENT DOCUMENTS

| | | | |
|---|---|---|---|
| 4,959,621 | 9/1990 | Hosticka et al. | 330/258 X |
| 5,202,645 | 4/1993 | Phan et al. | 330/253 |
| 5,206,602 | 4/1993 | Baumgartner et al. | |

FOREIGN PATENT DOCUMENTS 1126811  5/1989  Japan .

OTHER PUBLICATIONS

T. Morie et al.; "A System for Analog Circuit Design that Stores and Re-Uses Design Procedures"; IEEE 1993 Custom Integrated Circuits Conference; pp. 13.4.1–13.4.4. May, 1993.

R. Castello et al.; "Analog Front End of an ECBM Transceiver for ISDN"; IEEE Journal of Solid State Circuits, vol. 25, No. 6, Dec. 1990, pp. 1575–1585.

European Search Report.

R. Gregorian et al.; "Analog MOS Integrated Circuits for Signal Processing"; A Wiley–Interscience Publication, 1986, pp. 254–257.

C. Toumazou et al., eds.; "Analogue IC Design: The Current–Mode Approach"; Peter Peregrinus Ltd., 1990, pp. 182–183 and 234–238.

Primary Examiner—James B. Mullins
Attorney, Agent, or Firm—Whitham, Curtis, Whitham & McGinn

[57] ABSTRACT

In a fully differential amplifier so configured that an operating point potential of positive and negative output terminals of a differential amplifier having an active load is set by a common-mode feedback circuit, the common-mode feedback circuit includes a first differential pair receiving a reference potential given from an external and a positive output potential of the differential amplifier, a second differential pair receiving the reference potential and a negative output potential of the differential amplifier, and a sum current feedback device for giving a sum current of output currents of the first and second differential pairs to a bias current for the active load of the differential amplifier. With this arrangement, a difference between a common-mode output potential of the differential amplifier and the reference potential is fed back to the differential amplifier in the form of the sum current, so as to control to equalize the common-mode output potential of the differential amplifier with the reference potential.

8 Claims, 4 Drawing Sheets

5,568,089

FULLY DIFFERENTIAL AMPLIFIER INCLUDING COMMON MODE FEEDBACK CIRCUIT

BACKGROUND OF THE INVENTION

1. Field of the Invention

The present invention relates to a fully differential amplifier, and more specifically to a fully differential amplifier so configured that an operating point potential of positive and negative output terminals of a differential amplifier having an active load is controlled by a common-mode feedback circuit.

2. Description of Related Art

A common-mode feedback circuit incorporated in a fully differential amplifier is ordinarily provided to set an operating potential of inverted and non-inverted output terminals of the fully differential amplifier. An example of the common-mode feedback circuit is described in Roubik Gregorian et al "ANALOG MOS INTEGRATED CIRCUITS FOR SIGNAL PROCESSING", Pages 254–256, A Wiley-Interscience Publication, 1986, the content of which is incorporated by reference in its entirety into this specification. However, this common-mode feedback circuit has only a narrow output operating range, because a number of transistors are series-connected between a positive voltage supply line and a negative voltage supply line. In addition, in order to freely set an output voltage, it is necessary to adjust the area of various circuit elements. In conclusion, this common-mode feedback circuit was very complicated in design.

In order to improve the above mentioned common-mode feedback circuit, it has been considered to detect a neutral point (common-mode output potential) between a positive output terminal and a negative output terminal of the fully differential amplifier, to compare the detected common-mode output potential with a reference potential, and to feed back the result of comparison to a control electrode of a transistor which constitutes an active load for the fully differential amplifier, for the purpose of equalizing the common-mode output potential with the reference potential. However, in a cascaded type of fully differential amplifier, if a resistor is directly connected to the output terminal so that a potential on the neutral point is detected by use of a resistor voltage division, a gain lowers, and therefore, an advantage of the cascaded type cannot be exerted.

Under this circumstance, it has been proposed to interpose a high impedance buffer and to detect the common-mode output potential from an output of the high impedance buffer by means of a voltage division resistor or a current addition. One typical example of this type fully differential amplifier will be described with reference to Japanese Patent Application Laid-open No. JP-A-01-126811, which discloses the differential amplifier applied with the current addition method, and the content of which is incorporated by reference in its entirety into this specification.

Referring to FIG. 1, there is shown a circuit diagram of the fully differential amplifier disclosed in the above identified Japanese patent application publication. In the shown fully differential amplifier, voltage controlled current circuits 100 and 200 are connected to output terminals 19 and 18 of a core amplifier 500, respectively, for the purpose of convening each output voltage into a current. The currents thus obtained am combined by a sum current transmission circuit 300 so as to generate a sum current, which is compared at a node A with a reference current generated in a reference current transmission circuit 400. The result of comparison is fed back so as to control a gate voltage of transistors $Q_{27}$ and $Q_{28}$, which constitute a portion of an active load of the fully differential amplifier. With this feedback operation, the common-mode output voltage becomes equal with the reference potential $V_{REF}$.

However, paying attention to the core amplifier 500, a connection node between a drain of a transistor $Q_{23}$ and a source of a transistor $Q_{25}$ and a connection node between a drain of a transistor $Q_{24}$ and a source of a transistor $Q_{26}$ are put in a low impedance condition, since a gate of each of the transistors $Q_{24}$ and $Q_{26}$ are grounded. Accordingly, poles of higher powers caused by a parasitic capacitance are moved into a high frequency zone, and therefore, a sufficient phase margin can be obtained by a pole of a primary power formed by a low load capacitance $C_L$. As a result, the core amplifier can have a high cutoff frequency $f_T$ suitable for a high speed operation.

However, examining the common-mode feedback circuit, poles of higher powers in the common-mode loop are moved into a low frequency zone, because of parasitic capacitances $C_1$ and $C_2$ occurring in parallel to resistors $R_1$ and $R_2$ connected to sources of transistors $Q_{32}$ and $Q_{33}$, and because of a gate capacitance $C_3$ of gates of transistors $Q_{27}$ and $Q_{28}$ which are control electrodes for applying the feedback through the common-mode feedback circuit. As a result, although the core amplifier 500 has a sufficient phase margin, it is necessary to increase the load capacitance $C_L$ in order to cause the common-mode feedback circuit to have a phase margin.

This is also true in a common-mode output detection method. Namely, because of a voltage division resistor and a gate capacitance of a transistor receiving a voltage obtained by the voltage division resistor, poles of higher powers in the common-mode loop are moved into a low frequency zone, with the result that the toad capacitance $C_L$ must be increased for the purpose of causing the common-mode feedback circuit to have a phase margin.

SUMMARY OF THE INVENTION

Accordingly, it is an object of the present invention to provide a fully differential amplifier which has overcome the above mentioned defect of the conventional ones.

Another object of the present invention is to provide a fully differential amplifier having an excellent high speed operation property.

Still another object of the present invention is to provide a fully differential amplifier in which a high speed operation of a core amplifier is not hindered by a common-mode feedback circuit.

The above and other objects of the present invention are achieved in accordance with the present invention by a fully differential amplifier so configured that an operating point potential of positive and negative output terminals of a differential amplifier having an active load is set by a common-mode feedback circuit, the common-mode feedback circuit including a first differential pair receiving a reference potential given from an external and a positive output potential of the differential amplifier, a second differential pair receiving the reference potential and a negative output potential of the differential amplifier, and a sum current feedback means for giving a sum current of output currents of the first and second differential pairs to a bias current for the active load of the differential amplifier, so that a difference between a common-mode output potential of the differential amplifier and the reference potential is fed back to the differential amplifier in the form of the sum current, so as to control to equalize the common-mode output potential of the differential amplifier with the reference potential.

The above and other objects, features and advantages of the present invention will be apparent from the following description of preferred embodiments of the invention with reference to the accompanying drawings.

DESCRIPTION OF THE PREFERRED EMBODIMENTS

Figure 2:
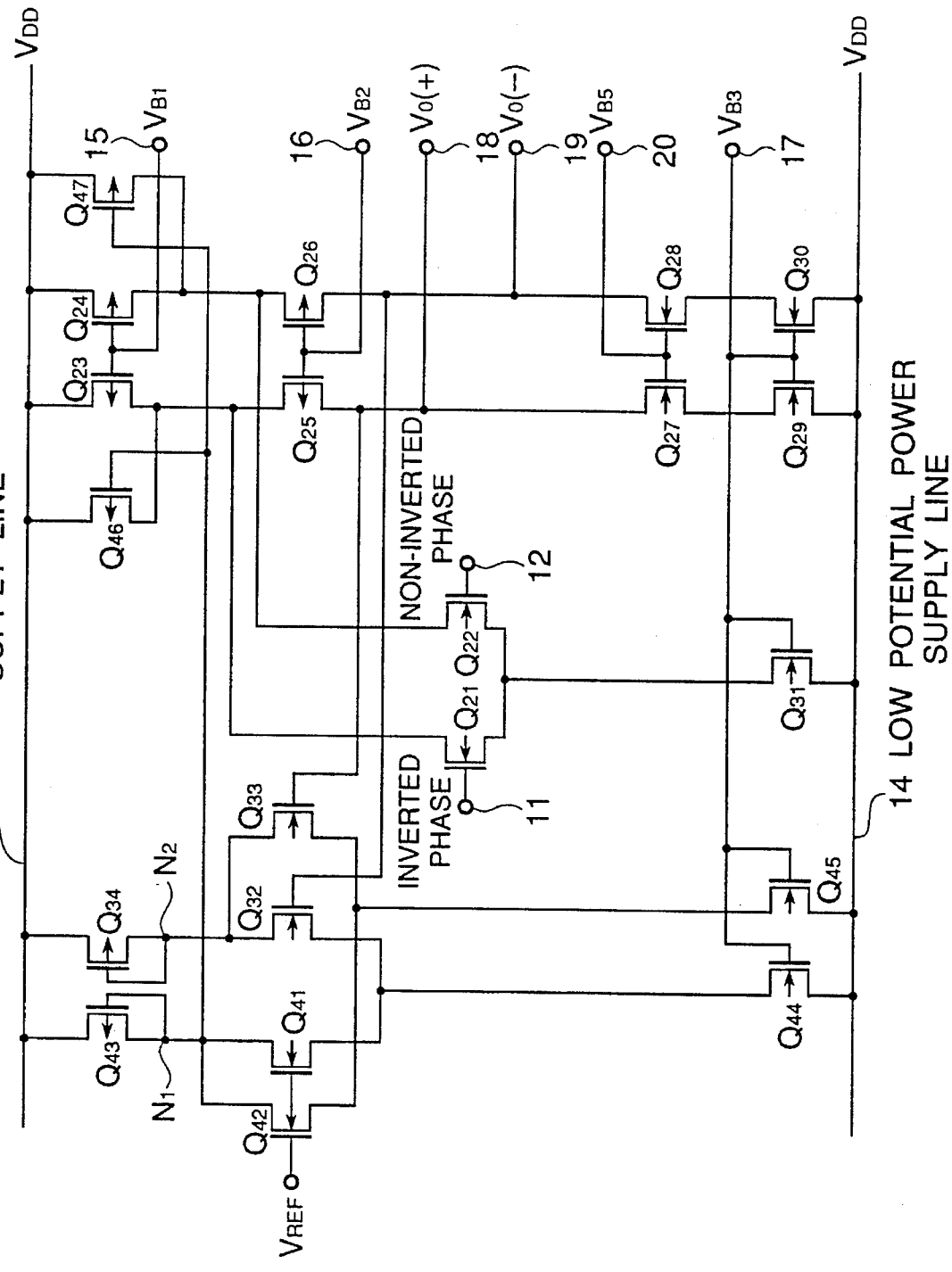
FIG. 2 is a circuit diagram of a first embodiment of the fully differential amplifier in accordance with the present invention.

Referring to FIG. 2, there is shown a circuit diagram of a first embodiment of the fully differential amplifier in accordance with the present invention. The shown fully differential amplifier includes an input terminal 11 for receiving an inverted phase input, and another input terminal 12 for receiving a non-inverted phase input. The input terminals 11 and 12 are connected to a gate of N-channel MOS transistors $Q_{21}$ and $Q_{22}$, respectively, which have their sources connected in common to a drain of an N-channel MOS transistor $Q_{31}$. Drains of the MOS transistors $Q_{21}$ and $Q_{22}$ are connected to drains of P-channel MOS transistors $Q_{23}$ and $Q_{24}$, respectively, which have their sources connected to a high potential power supply line 13. In addition, the drains of the MOS transistors $Q_{23}$ and $Q_{24}$ are also connected to sources of P-channel MOS transistors $Q_{25}$ and $Q_{26}$, respectively, whose drains are connected to drains of N-channel MOS transistors $Q_{27}$ and $Q_{28}$, respectively, and also connected to gates of N-channel MOS transistors $Q_{33}$ and $Q_{32}$, respectively. Sources of the MOS transistors $Q_{27}$ and $Q_{28}$ are connected to drains of N-channel MOS transistors $Q_{29}$ and $Q_{30}$, respectively, which have their sources connected to a low potential power supply line 14.

In the above mentioned circuit, the transistors $Q_{21}$ to $Q_{30}$ constitute a core circuit of the fully differential amplifier, and the transistors $Q_{23}$ and $Q_{24}$ constitute an active load circuit. Commonly connected gates of the transistors $Q_{23}$ and $Q_{24}$ are supplied with a bias potential $V_{B1}$ through a voltage terminal 15. Commonly connected gates of the transistors $Q_{25}$ and $Q_{26}$ are supplied with a bias potential $V_{B2}$ through a voltage terminal 16. Commonly connected gates of the transistors $Q_{27}$ and $Q_{28}$ are supplied with a bias potential $V_{B5}$ through a voltage terminal 20. Gates of the transistors $Q_{29}$, $Q_{30}$ and $Q_{31}$ and also N-channel MOS transistors $Q_{44}$ and $Q_{45}$ are supplied with a bias potential $V_{B3}$ through a voltage terminal 17.

In addition, a positive output voltage Vo(+) and a negative output voltage Vo(−) are obtained from output terminals 18 and 19 connected to the drains of the transistors $Q_{25}$ and $Q_{26}$, respectively. The positive output voltage Vo(+) is compared with a reference voltage Vref by a differential pair composed of N-channel MOS transistors $Q_{33}$ and $Q_{42}$, and the negative output voltage Vo(−) is compared with the reference voltage Vref by a differential pair composed of N-channel MOS transistors $Q_{32}$ and $Q_{41}$.

Drains of the transistors $Q_{41}$ and $Q_{42}$ are connected in common to a drain and a gate of a P-channel MOS transistor $Q_{43}$, which has its source connected to the high potential power supply line 13. Accordingly, output currents of these differential pairs are summed by the P-channel MOS transistor $Q_{43}$, which constitutes an active load in common to the two differential pairs. Drains of the transistors $Q_{32}$ and $Q_{33}$ are connected in common to a drain and a gate of a P-channel MOS transistor $Q_{34}$, which has its source connected to the high potential power supply line 13. Sources of the transistors $Q_{41}$ and $Q_{32}$ are connected in common to a drain of the transistor $Q_{44}$, and sources of the transistors $Q_{42}$ and $Q_{33}$ are connected in common to a drain of the transistor $Q_{44}$. Source of the transistors $Q_{44}$ and $Q_{45}$ are connected to the low potential power supply line 14.

In addition, P-channel MOS transistors $Q_{46}$ and $Q_{47}$ are connected in parallel to the transistors $Q_{23}$ and $Q_{24}$, respectively. Drains of the transistors $Q_{46}$ and $Q_{47}$ are connected in common to the drain of the transistors $Q_{43}$.

Now, a feedback operation of the above mentioned circuit will be described. Now, general consideration will be made on a differential amplifier composed of MOS transistors (for example, in FIG. 2, the transistors $Q_{32}$ and $Q_{41}$ connected in the form of a differential pair, and the transistor $Q_{43}$ constituting the active load, and the N-channel MOS transistor $Q_{44}$ acting as a constant current source). As described in for example. C. Toumazou et al, "Analog IC design: the current-mode approach", Page 183 and Pages 235–238, Peter Peregrinus Ltd., 1990, the content of which is incorporated by reference in its entirety into this specification, the relation between an output current $I_{01}$ (the current flowing through the transistor $Q_{43}$) and an input voltage difference $V_{id}$ (the difference between the reference potential Vref and the inverted phase output Vo(−) of the core amplifier) is expressed as follows:

$$I_{01}=(2 \cdot I_{SS} \cdot K)^{1/2} \cdot V_{id} \cdot \{1-[(K/2) \cdot I_{SS}] \cdot V_{id}^2\}^{1/2}$$

where $2 \cdot I_{SS}$ is the current flowing through the transistor $Q_{44}$ which constitutes the constant current source, and K is defined as follows:

$$K = \mu \cdot C_{ox} \cdot W/ 2 \cdot (1+) \cdot L$$

where

=carrier mobility of MOS transistor $C_{ox}$=gate oxide film capacitance per unit area W=channel width L=channel length δ=correction coefficient (≈0)

In the above equation, $\{1-[(K/2) \cdot I_{SS}] \cdot V_{id}^2\}^{1/2}$ is an even function with respect to $V_{id}$, and therefore. $I_{01}$ is an odd function with respect to $V_{id}$. In addition, this output current $I_{01}$ is not linear in relation to the input voltage difference $V_{id}$. However, in the case that a deviation of the common-mode output potential, namely, of a ½ potential of the sum of the non-inverted phase output and the inverted phase output of the core amplifier including the transistors $Q_{21}$ and $Q_{22}$ is small, it is possible to constitute, in the following manner, a feedback loop having, as the amount of feedback, the difference between the reference potential Vref and the common-mode output potential, by utilizing the fact that $I_{01}$ is the odd function with respect to $V_{id}$.

In the circuit shown in FIG. 2, consider the two differential pairs composed of the MOS transistors $Q_{32}$ and $Q_{41}$ and the MOS transistors $Q_{33}$ and $Q_{42}$, respectively. When the reference voltage Vref is equal to the common-mode output voltage, assuming that the input voltage difference in the differential pair composed of the MOS transistors $Q_{32}$ and $Q_{41}$ is $V_{id}$, the input voltage difference in the differential pair composed of the MOS transistors $Q_{33}$ and $Q_{42}$ becomes $-V_{id}$. Accordingly, the output currents $I_{01}$ and $I_{02}$ of the two differential pairs, which are an odd function with respect to their input voltage difference, have polarities opposite to each other, and therefore, cancel out each other. Therefore, the sum current $I_0$ (the current flowing through the transistor $Q_{43}$, namely, $I_{01}+I_{02}$) does not change, similarly to the case of no input. In other words, no adverse influence is given to a normal operation.

If the reference potential Vref becomes different from the common-mode output potential, for example, when the common-mode output potential becomes higher than the reference potential Vref, the current of the transistor $Q_{43}$ decreases. In this case, since a linear operation can be approximated in a small output amplitude region, it is possible to detect the difference between the reference potential and the common-mode output potential with no problem. On the other hand, the linear operation cannot be approximated in a large output amplitude region. However, if the potential difference $\Delta V$ between the reference potential and the common-mode output potential is small as compared with the amplitude, it is sufficient if a differentiated coefficient in the amplitude is considered. Here, since the differentiated coefficient of the odd function is an even-function, differentiations of the respective output currents of the above mentioned two differential pairs which have lo opposite polarities but are the same in absolute value, become equal. Accordingly, the sum current of the output currents caused by the potential difference $\Delta V$ is in proportion to the potential difference $\Delta V$. Here, precisely, since the differentiated coefficient is different if the amplitude is different, the amount of feedback varies dependently upon the amplitude. However, since the loop gain in the feedback loop is sufficiently large, influence to the non-inverted output and the inverted output can be neglected. Thus, the feedback loop having as the amount of feedback the difference between the reference potential Vref and the common-mode output potential, is constituted.

In the circuit shown in FIG. 2, the transistors $Q_{43}$, $Q_{46}$ and $Q_{47}$ constitute a current mirror circuit, and drains of the transistors $Q_{46}$ and $Q_{47}$ are connected to the drains of the transistors $Q_{23}$ and $Q_{24}$, respectively. Accordingly, if the current of the transistors $Q_{43}$ decreases, the currents of the transistors $Q_{46}$ and $Q_{47}$ correspondingly decrease, so that the bias current of the core amplifier decreases, and therefore, the common-mode output potential decreases.

If the common-mode output potential becomes lower than the reference potential Vref, a similar consideration may result. Namely, the feedback operation is performed to elevate the common-mode output potential so that the common-mode output potential becomes equal to the reference potential Vref.

Now, poles of higher powers in the common-mode loop will be examined. In this embodiment, since no resistor is used for detecting the common-mode output potential, differently from the conventional fully differential amplifier, there is no influence caused by a parasitic capacitance occurring in parallel to a resistor. In addition, the feedback of the common-mode feedback circuit is applied in the form of a current by the current mirror circuit, the circuit is not influenced by a gate capacitance of the transistor (constituting the control electrode).

In the circuit shown in FIG. 2, attention will be paid to a connection node $N_1$ between the drain electrodes of the transistor $Q_{43}$ and the drain electrodes of the transistor $Q_{41}$ and $Q_{42}$, and a connection node $N_2$ between the drain electrodes of the transistor $Q_{34}$ and the drain electrodes of the transistor $Q_{32}$ and $Q_{33}$. A resistance at the respective connection nodes $N_1$ and $N_2$ are made to $1/g_m$ (where $g_m$ is transconductance) by the transistors $Q_{43}$ and $Q_{34}$, respectively, and therefore, are constituted to have a low resistance. Namely, it would be understood that it is put in a low impedance condition. Accordingly, poles of higher powers caused by a parasitic capacitance will be moved into a high frequency zone. This is also true at a connection node between each differential pair and its current source. Examining a connection node between the constant current source transistor $Q_{44}$ and the drain electrodes of the transistor $Q_{32}$ and $Q_{41}$, and a connection node between the constant current source transistor $Q_{45}$ and the drain electrodes of the transistor $Q_{33}$ and $Q_{42}$, since the reference potential Vref is a fixed potential, it can be regarded from the viewpoint of the respective connection nodes that the transistors $Q_{41}$ and $Q_{42}$ are in a gate-grounded fashion, namely, have a low input impedance. Therefore, the respective connection nodes are put in a low input impedance condition.

Figure 3:
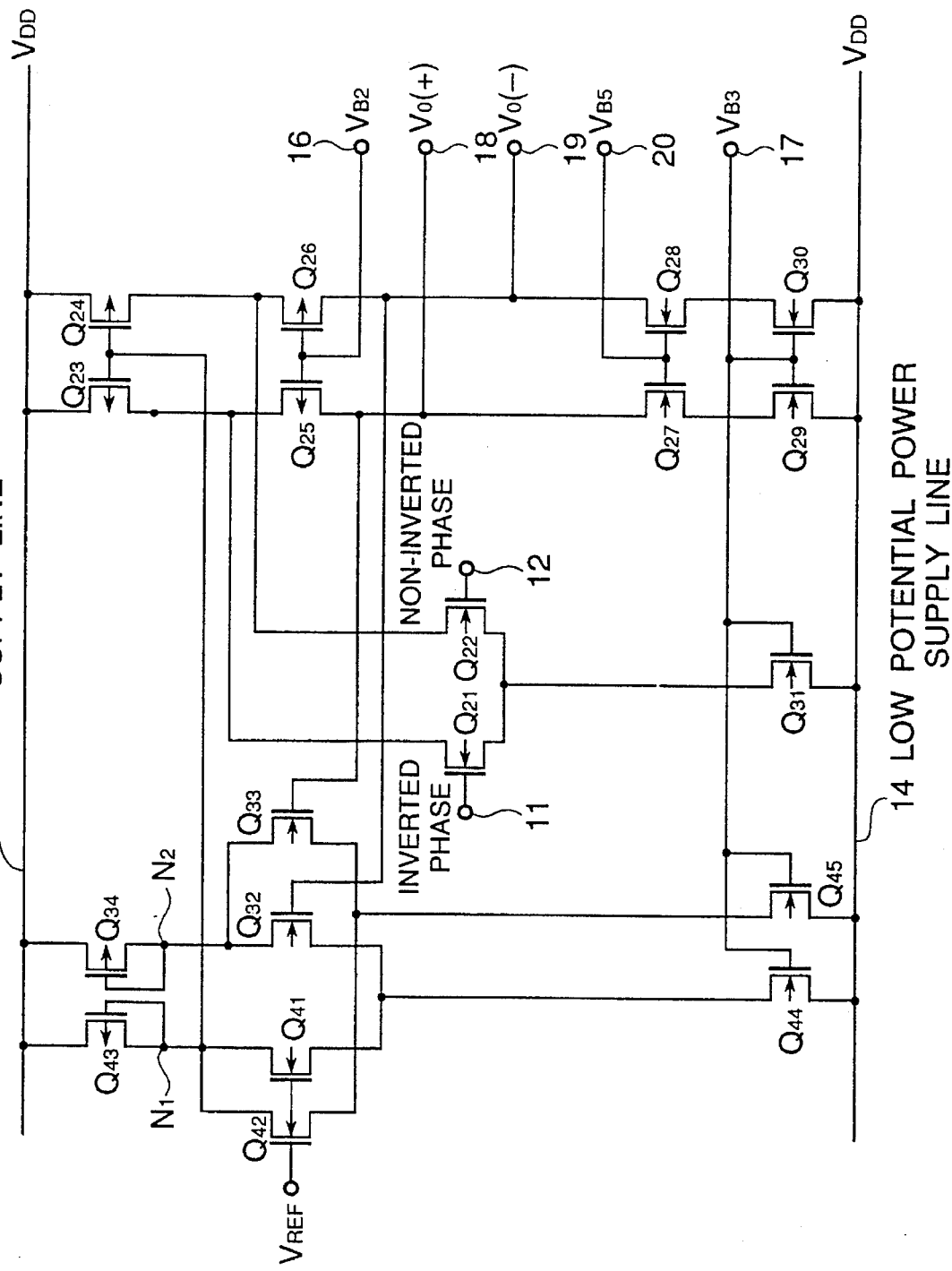
FIG. 3 is a circuit diagram of a second embodiment of the fully differential amplifier in accordance with the present invention.

Now, a second embodiment of the fully differential amplifier in accordance with the present invention will be described with reference to FIG. 3, which is a circuit diagram of the second embodiment. In FIG. 3, elements corresponding to those shown in FIG. 2 are given the same Reference Numerals, and explanation thereof will be omitted.

As will be seen from comparison between FIGS. 2 and 3, the second embodiment is characterized in that the transistors $Q_{23}$, $Q_{24}$, $Q_{46}$ and $Q_{47}$ are consolidated or simplified into two transistors $Q_{23}$ and $Q_{24}$. The transistors $Q_{23}$ and $Q_{24}$ constitutes a current mirror circuit in cooperation with the transistor $Q_{43}$ through which the sum current of the two differential pairs of the common-mode feedback circuit flows.

Similarly to the first embodiment, respective connection nodes in the second embodiment are constituted in a low impedance condition which is not influenced by parasitic capacitances.

Figure 1:
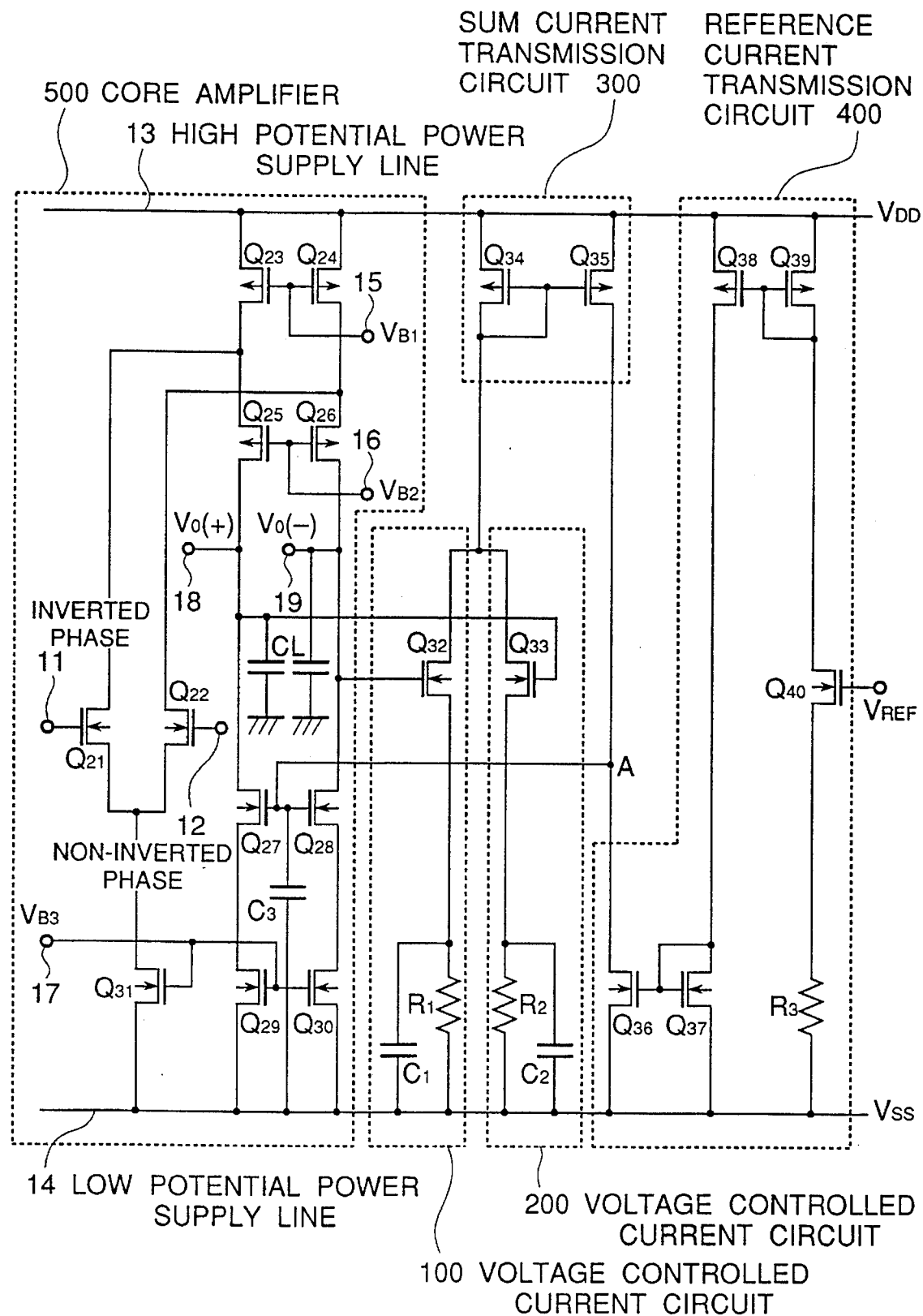
FIG. 1 is a circuit diagram of the conventional fully differential amplifier.
Figure 4:
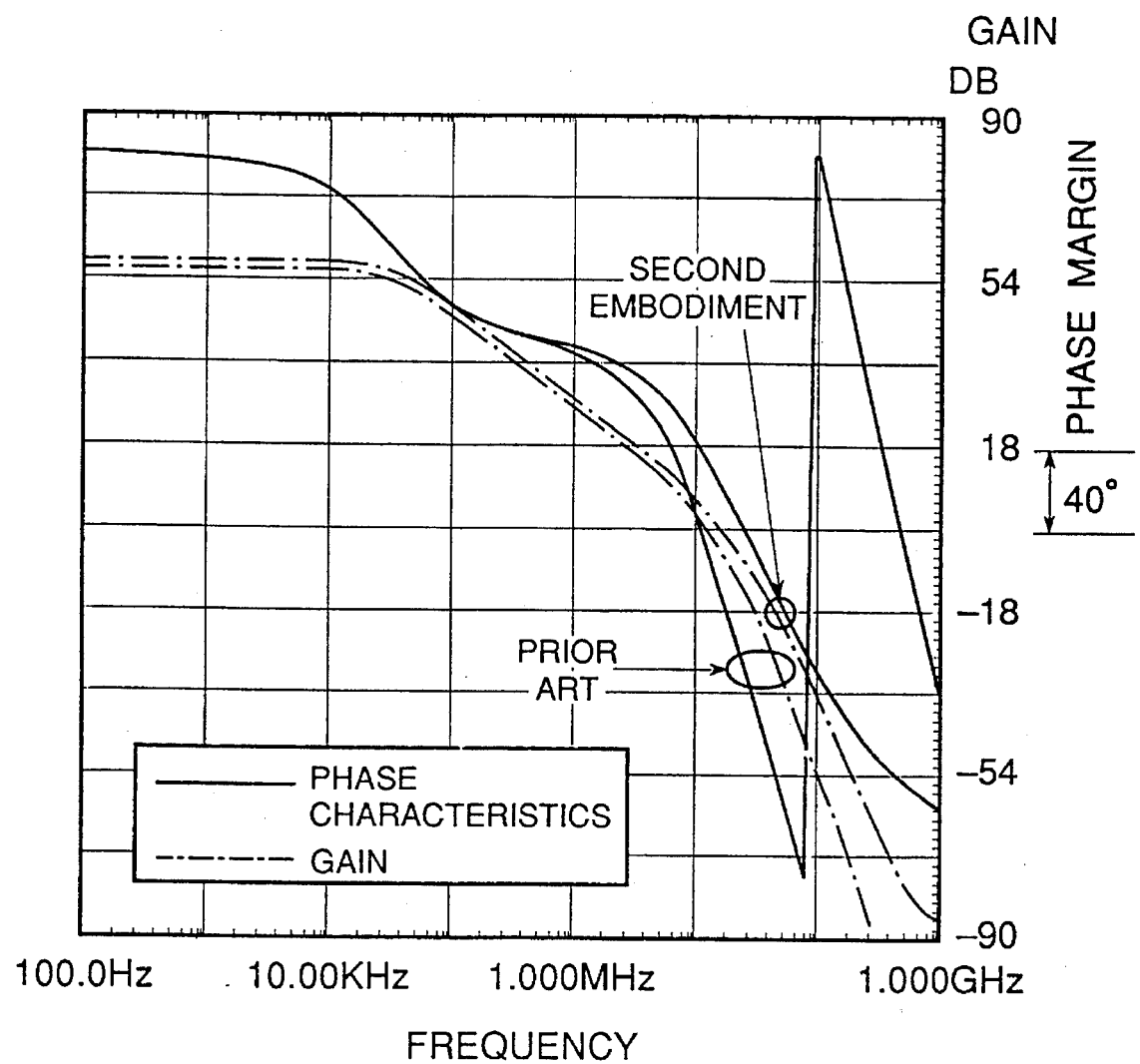
FIG. 4 is a graph illustrating phase characteristics and amplitude characteristics of the second embodiment of the fully differential amplifier and the conventional fully differential amplifier.

Referring to FIG. 4, there is shown phase characteristics and the amplitude characteristics (gain) in the second embodiment of the fully differential amplifier in accordance with the present invention and in the conventional fully differential amplifier shown in FIG. 1, which were obtained from a simulation based on a SPICE (Simulation Program with Integrated Circuit Emphasis). In FIG. 4, the axis of ordinates shows the phase and the gain, and the axis of abscissas indicates the frequency. In addition, the solid lines represent the phase characteristics, and the two-dot chain lines show the amplitude characteristics. In both of the solid lines and the two-dot chain lines, an upper solid line and an upper two-dot chain line indicate the second embodiment of the present invention, and a lower solid line and a lower two-dot chain line indicate the conventional fully differential amplifier shown in FIG. 1.

It will be seen from FIG. 4 that the embodiment of the present invention has a phase margin on the order of 30° to 40°, but the phase margin of the conventional fully differential amplifier is almost 0° when the same lead capacitance is given. Namely, since it cannot be said that a given circuit is stable if the phase margin is on the order of a few degrees, the conventional fully differential amplifier had to be constructed to have an increased lead capacitance for the purpose of stabilizing the operation. However, the embodiment of the present invention has no necessity for an increased lead capacitance, and therefore, it is possible to realize a fully differential amplifier which has a high cutoff frequency $f_T$ and which therefore is suitable for a high speed operation.

As mentioned above, in the fully differential amplifier in accordance with the present invention, the common-mode output potential is detected by addition in the current mode, and fed back to the core amplifier in the current mode. In other words, the common-mode feedback circuit is constituted of the two differential pairs and the current minor circuit. Accordingly, the respective connection nodes in the common-mode feedback circuit are maintained in the low impedance condition, and therefore, the circuit is not influenced by a parasitic capacitance. In addition, since poles of higher powers caused by a parasitic capacitance are moved into a high frequency zone, a sufficient phase margin can be obtained by a pole of a primary power created by a low load capacitance.

Thus, the present invention can overcome the disadvantage of the conventional fully differential amplifier in which although a core amplifier has a sufficient phase margin, a common-mode feedback circuit had to have an increased load capacitance for the purpose of having a phase margin, with the result that a high speed operation was inevitably sacrificed. In other words, the present invention makes it possible to provide a fully differential amplifier which has a high cutoff frequency $f_T$ and which therefore is suitable for a high speed operation, since the fully differential amplifier in accordance with the present invention can be stabilized without increasing the load capacitance.

The invention has thus been shown and described with reference to the specific embodiments. However, it should be noted that the present invention is in no way limited to the details of the illustrated structures but changes and modifications may be made within the scope of the appended claims.

I claim:

1. A fully differential amplifier, comprising:

a differential amplifier having positive and negative output terminals;

a common-mode feedback circuit for setting an operating point potential of said positive and negative output terminals of said differential amplifier having an active load, said common-mode feedback circuit including:

a first differential pair for receiving a reference potential given from an external source and a positive output potential of said differential amplifier;

a second differential pair for receiving said reference potential and a negative output potential of said differential amplifier; and a sum current feedback means for producing a sum current of output currents of said first and second differential pairs to a bias current for said active load of said differential amplifier, so that a difference between a common-mode output potential of said differential amplifier and said reference potential is fed back to said differential amplifier in the form of the sum current, so as to controllably equalize the common-mode output potential of said differential amplifier with said reference potential, wherein said sum current feedback means includes:

a first transistor connected to said first and second differential pairs as a common active load, second and third transistors connected to said differential amplifier as an active load, and fourth and fifth transistors connected in parallel to said second and third transistors, respectively, said first, fourth and fifth transistors being connected to constitute a current mirror circuit.

2. A fully differential amplifier, comprising:

a differential amplifier having positive and negative output terminals;

a common-mode feedback circuit for setting an operating point potential of said positive and negative output terminals of said differential amplifier having an active load, said common-mode feedback circuit including:

a first differential pair for receiving a reference potential given from an external source and a positive output potential of said differential amplifier;

a second differential pair for receiving said reference potential and a negative output potential of said differential amplifier; and a sum current feedback means for producing a sum current of output currents of said first and second differential pairs to a bias current for said active load of said differential amplifier, so that a difference between a common-mode output potential of said differential amplifier and said reference potential is fed back to said differential amplifier in the form of the sum current, so as to controllably equalize the common-mode output potential of said differential amplifier with said reference potential, wherein said sum current feedback means includes:

a first transistor connected to said first and second differential pairs as a common active load; and second and third transistors connected to said differential amplifier as an active load, said first, second and third transistors being connected to constitute a current mirror circuit.

3. A fully differential amplifier comprising:

a first input terminal for receiving an inverted phase input;

a second input terminal for receiving a non-inverted phase input;

first and second output terminals for outputting a pair of complementary output signals;

a core circuit including a first N-channel MOS transistor having a gate connected to said first input terminal, a second N-channel MOS transistor having a gate connected to said second input terminal, said first and second N-channel MOS transistors having their sources commonly connected to one end of a current source having its other end grounded, the core circuit further including an active load having first and second P-channel MOS transistors which have their source connected to a high potential power supply line, drains of said first and second P-channel MOS transistors being connected to drains of said first and second N-channel MOS transistors, respectively, gates of said first and second P-channel MOS transistors being commonly connected, the core circuit further including third and fourth P-channel MOS transistors which have their source connected to said drains of said first and second P-channel MOS transistors, respectively, drains of said third and fourth P-channel MOS transistors being connected to said first and second output terminals, respectively, and also connected to ground through a pair of current sources, gates of said third and fourth P-channel MOS transistors being commonly connected to receive a predetermined bias voltage;

a first differential pair composed of third and fourth N-channel MOS transistors, a drain of said third N-channel MOS transistor being connected to a drain and a gate of a fifth P-channel MOS transistor, which has its source connected to said high potential power supply line, a drain of said fourth N-channel MOS transistor being connected to a drain and a gate of a sixth P-channel MOS transistor, which has its source connected to said high potential power supply line, sources of said third and fourth N-channel MOS transistors being commonly connected to one end of a current source having its other end grounded, a gate of said third N-channel MOS transistor being connected to said first output terminal, and a gate of said fourth N-channel MOS transistor being connected to a reference voltage, so that a positive output voltage on said first output terminal is compared with said reference voltage;

a second differential pair comprising:
fifth and sixth N-channel MOS transistors, a drain of said fifth N-channel MOS transistor being connected to said drain and said gate of said fifth P-channel MOS transistor, a drain of said sixth N-channel MOS transistor being connected to said drain and said gate of said sixth P-channel MOS transistor, sources of said fifth and sixth N-channel MOS transistors being commonly connected to one end of a current source having its other end grounded, a gate of said fifth N-channel MOS transistor being connected to said second output terminal, and a gate of said sixth N-channel MOS transistor being connected to said reference voltage, so that a negative output voltage on said second output terminal is compared with said reference voltage, said drains of said fourth and sixth N-channel MOS transistors being connected to control a current flowing through said active load, so that a difference between a common-mode output potential of said differential amplifier and said reference potential is fed back to said differential amplifier in the form of a sum current, so as to controllably equalize the common-mode output potential of said differential amplifier with said reference potential.

4. A fully differential amplifier as claimed in claim 3, wherein said drains of said fourth and sixth N-channel MOS transistors are connected to said commonly connected gates of said first and second P-channel MOS transistors.

5. A fully differential amplifier as claimed in claim 3, wherein said commonly connected gates of said first and second P-channel MOS transistors are connected to a common fixed bias voltage, and wherein said drains of said fourth and sixth N-channel MOS transistors are connected to commonly-connected gates of seventh and eighth P-channel MOS transistors which have their source connected to said high potential power supply line and their drains connected to said drains of said first and second P-channel MOS transistors, respectively.

6. A fully differential amplifier as claimed in claim 3, wherein said commonly-connected gates of said first and second P-channel MOS transistors are connected to a common fixed bias voltage.

7. A fully differential amplifier as claimed in claim 6, wherein said drains of said fourth and sixth N-channel MOS transistors are connected to a commonly-connected gates of seventh and eighth P-channel MOS transistors which have their source connected to said high potential power supply line and their drains connected to said drains of said first and second P-channel MOS transistors, respectively.

8. A fully differential amplifier as claimed in claim 3, wherein said drains of said fourth and sixth N-channel MOS transistors are connected to a commonly-connected gates of seventh and eighth P-channel MOS transistors which have their source connected to said high potential power supply line and their drains connected to said drains of said first and second P-channel MOS transistors, respectively.

* * * * *